(12) United States Patent
Saint-Marc et al.

(10) Patent No.: US 11,453,503 B2
(45) Date of Patent: Sep. 27, 2022

(54) COUPLING FOR CONNECTING AIR CIRCUIT PORTIONS OF AVIONICS RACK

(71) Applicant: AIRBUS OPERATIONS (S.A.S.), Toulouse (FR)

(72) Inventors: Laurent Saint-Marc, Montaigut sur Save (FR); Bernard Guering, Montrabe (FR)

(73) Assignee: AIRBUS OPERATIONS (S.A.S.), Toulouse (FR)

(*) Notice: Subject to any disclaimer, the term of this patent is extended or adjusted under 35 U.S.C. 154(b) by 771 days.

(21) Appl. No.: 16/444,419

(22) Filed: Jun. 18, 2019

(65) Prior Publication Data

US 2019/0389584 A1    Dec. 26, 2019

(30) Foreign Application Priority Data

Jun. 20, 2018  (FR) .................................. 1855445

(51) Int. Cl.

| *B64D 13/06* | (2006.01) |
|---|---|
| *F16L 25/00* | (2006.01) |
| *F16L 27/11* | (2006.01) |
| *F16L 27/107* | (2006.01) |
| *H05K 7/20* | (2006.01) |

(52) U.S. Cl.
CPC .......... *B64D 13/06* (2013.01); *F16L 25/0009* (2013.01); *F16L 27/107* (2013.01); *F16L 27/11* (2013.01); *H05K 7/20545* (2013.01); *B64D 2013/0614* (2013.01)

(58) Field of Classification Search
CPC .... H05K 7/1427; H05K 7/20545; H05K 7/20; H05K 5/06; H05K 5/061; H05K 7/18; F16L 27/11; F16L 27/107; F16L 25/0009; B64D 13/06; B64D 2013/0614
See application file for complete search history.

(56) References Cited

U.S. PATENT DOCUMENTS

| 5,813,867 A * | 9/1998 | Hodge | ................. H01R 12/721 439/63 |
| 2008/0290769 A1* | 11/2008 | Guering | ................... H02B 1/38 312/223.6 |

(Continued)

FOREIGN PATENT DOCUMENTS

| DE | 20 2008 004377 | 6/2008 |
| EP | 2 574 544 | 4/2013 |

(Continued)

OTHER PUBLICATIONS

French Search Report for French Application No. 1855445, two pages, dated Feb. 13, 2019.

*Primary Examiner* — Adam B Dravininkas
(74) *Attorney, Agent, or Firm* — Nixon & Vanderhye P.C.

(57) ABSTRACT

A coupling is disclosed providing fluidic continuity between first and second orifices of two portions of an air circuit which includes a flexible sleeve, a first frame connected in fluid-tight manner to a first end of the flexible sleeve and having a first opening, and a second frame, connected in fluid-tight manner to a second end of the flexible sleeve and having a second opening. The coupling is deformable so that the flexible sleeve may adapt to the variable spacing between two avionics racks and is able to compensate for a misalignment between the orifices of two portions of an air circuit.

12 Claims, 2 Drawing Sheets

(56) References Cited

U.S. PATENT DOCUMENTS

| | | | |
|---|---|---|---|
| 2009/0321105 A1* | 12/2009 | Sawyer | F16L 25/01 |
| | | | 138/120 |
| 2012/0062084 A1* | 3/2012 | Lewis, II | H05K 7/20009 |
| | | | 312/223.1 |
| 2012/0068452 A1 | 3/2012 | Boettner | |
| 2013/0208420 A1* | 8/2013 | Franklin | H05K 7/14 |
| | | | 211/183 |
| 2014/0147268 A1* | 5/2014 | Porte | F02C 7/04 |
| | | | 415/213.1 |
| 2014/0196394 A1* | 7/2014 | Greeson | B60J 10/80 |
| | | | 52/404.4 |
| 2016/0279378 A1* | 9/2016 | Cipollone | A61M 16/0069 |
| 2019/0170005 A1* | 6/2019 | Weaver | B64D 45/00 |

FOREIGN PATENT DOCUMENTS

| | | |
|---|---|---|
| EP | 3 301 344 | 4/2018 |
| WO | 96/00361 | 1/1996 |
| WO | 2004/000646 | 12/2003 |

\* cited by examiner

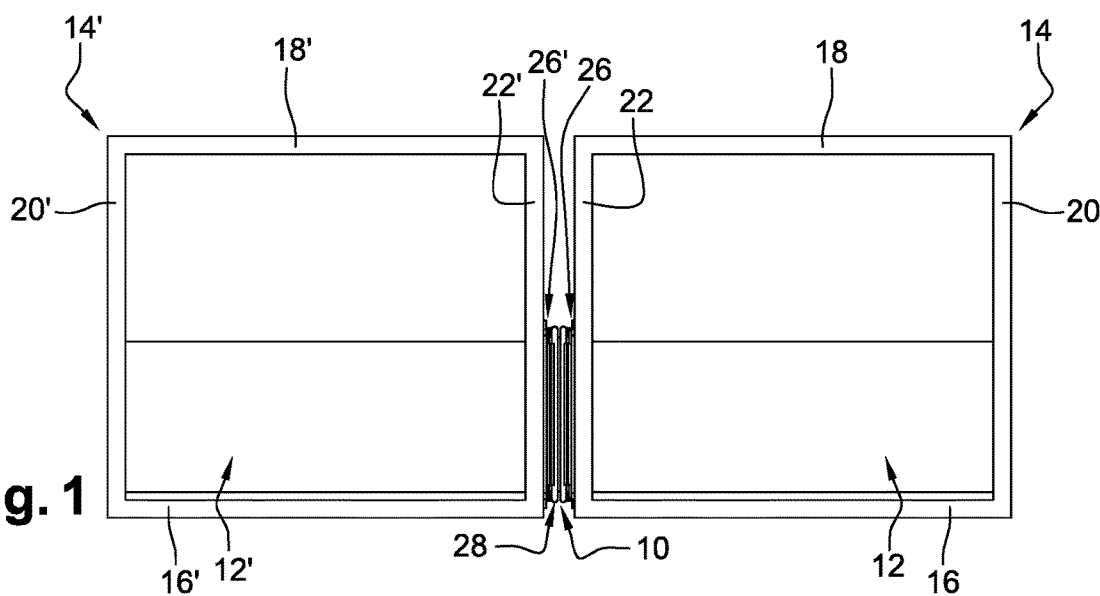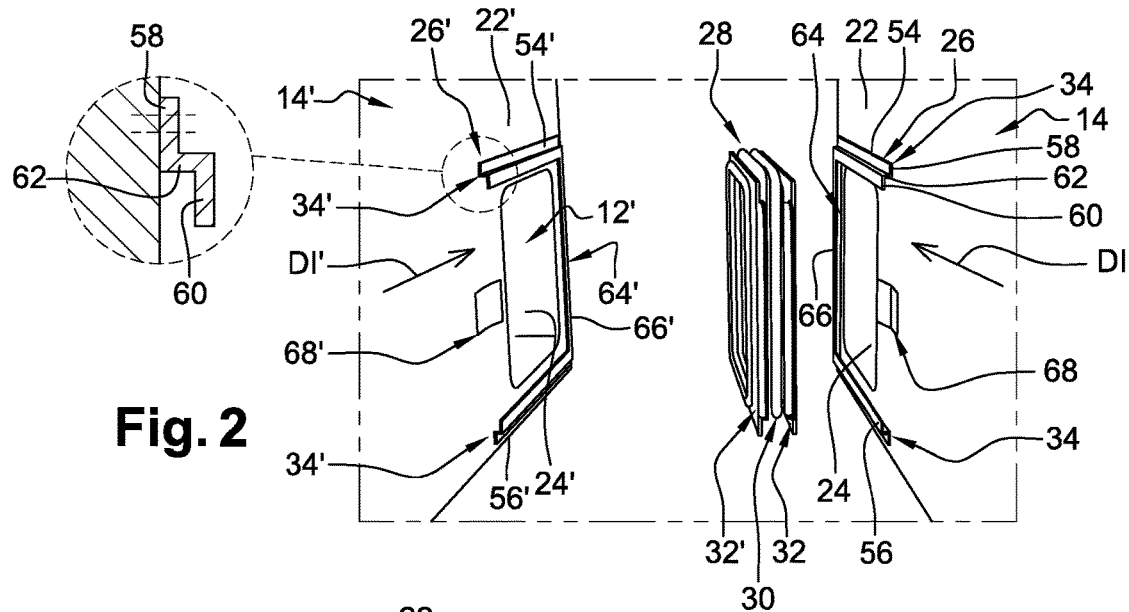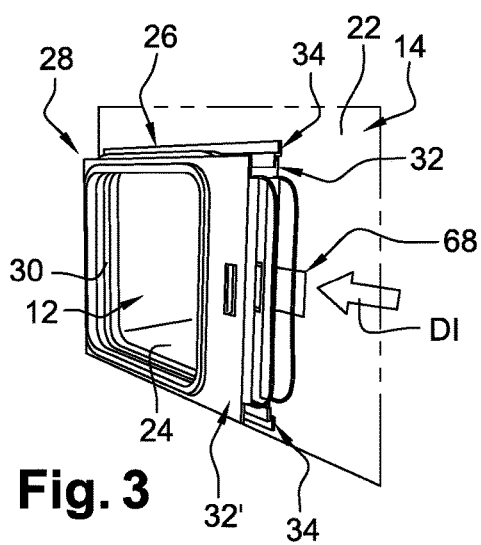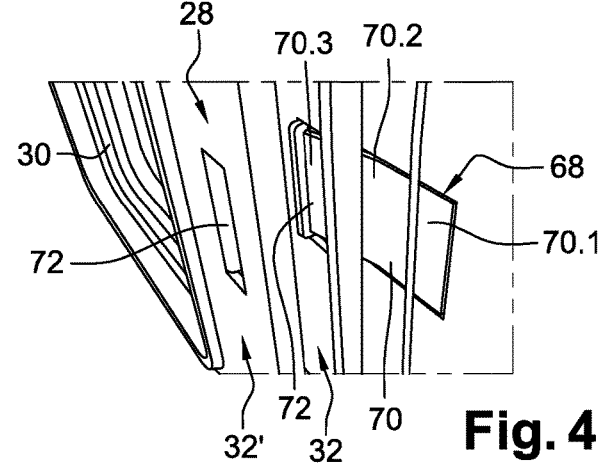

COUPLING FOR CONNECTING AIR CIRCUIT PORTIONS OF AVIONICS RACK

CROSS REFERENCE TO RELATED APPLICATION

This application claims priority to and incorporates by reference French Patent Application Number 1855445, filed Jun. 20, 2018.

BACKGROUND

1. Field of the Invention

The present application generally relates to a coupling for connecting two portions of an air circuit and, more specifically, to a connecting device including the coupling, and to an aircraft air circuit including the connecting device.

2. Description of the Related Art

An aircraft comprises an electrical and electronic bay (E&E bay) in which various hardware needed particularly for flying the airplane, for managing the electrical power and other networks such as communications and fluid networks are installed. Thus, this bay generally contains several avionics racks in which various electrical and/or electronic systems are housed.

An avionics rack may comprise a lower wall, an upper wall, two vertical lateral walls connecting the upper and lower walls and supporting shelves on which the electric and/or electronic systems are arranged. Given the increase in volume of the electrical and/or electronic systems, the avionics racks are closely spaced.

In order to cool the electrical and/or electronic systems, an avionics rack comprises a portion of an air circuit which portion is connected to another portion of the air circuit using a connecting device.

According to one way of achieving this, a connecting device is provided having a rigid sleeve inserted into the ends of the two air circuit portions that are to be connected and clamps positioned at each of the ends of the rigid sleeve in order to connect it to the air circuit portions. This approach requires a significant amount of clear space in the continuation of the ends of the portions of the air circuit so as to allow the rigid sleeve to be fitted. As a result, it is not suitable for connecting two air circuit portions that are incorporated into two closely spaced avionics racks.

SUMMARY

The present invention is embodied as a coupling for connecting a first orifice of a first portion of an air circuit opening onto a first wall, and a second orifice of a second portion of an air circuit opening onto a second wall, wherein the coupling comprises a flexible sleeve, a first frame having a first face, a second face connected in fluid-tight manner to a first end of the flexible sleeve, and a first opening connecting the first and second faces and a second frame having a first face, a second face connected in fluid-tight manner to a second end of the flexible sleeve and a second opening, connecting the first and second faces.

This coupling can be fitted, and easily and quickly installed without the use of tools, in a limited space between two avionics racks. As a result of its deformability, the flexible sleeve can adapt to the variable spacing between two avionics racks and is able to compensate for a misalignment between the orifices of two portions of an air circuit.

According to another feature, the first face of the first frame may compromise a first peripheral seal surrounding the first opening, and the first face of the second frame comprises a second peripheral seal surrounding the second opening. The coupling may include at least one handle.

According to an exemplary embodiment, one edge of at least one of the first and second frames has a hollow tube, each handle may comprise a cable having a portion housed inside the hollow tube, and ends connected to one another in order to form a loop.

The invention is also embodied as a connecting device for connecting a first orifice of a first portion of an air circuit opening onto a first wall and a second orifice of a second portion of an air circuit opening onto a second wall, the connecting device comprising:

a coupling according to the invention, a first coupling system configured to be connected to the first wall near the first orifice and including a first slide-way connection configured to allow the first frame to move with respect to the first wall in a first direction of introduction, parallel to the first wall, a second coupling system, configured to be connected to the second wall near the second orifice, comprising a second slide-way connection configured to allow the second frame to move with respect to the second wall in a second direction of introduction, parallel to the second wall, the coupling being able to move between a coupled state in which the flexible sleeve coincides with the first and second orifices and a disconnected state in which the flexible sleeve does not coincide with the first and second orifices.

According to another feature, each of the first and second slide-ways may comprise first and second brackets secured to the first or second wall, arranged on either side of the first or second orifice, and configured to accept first and second edges of the first or second frame of the coupling, the first and second brackets comprising first and second ends, respectively, via which the first or second frame is introduced, which flare out in order to make it easier for the first or second frame to be introduced.

According to another feature, at least one of the first and second coupling systems may comprise an end stop configured to halt the translational movement of the coupling in the coupled state.

According to another feature, at least one of the first and second coupling systems comprises a locking system configured to immobilize the coupling in a coupled state. the coupling being immobilized between the end stop and the locking system in the coupled state.

According to an exemplary embodiment, the locking system comprises a flexible tongue which has a base secured to the first or second wall as well as a tab portion having an end oriented towards the first or second orifice, configured to deform elastically between a rest state in which the end is spaced away from the first or second wall and immobilizes the coupling in the coupled state, and a deformed state in which the end is stuck against or close to the first or second wall so as to allow the coupling to be disconnected.

According to another feature, the locking system comprises at least one cutout, provided on at least one of the first and second frames, configured to house the end of the flexible tongue when the latter is in the rest state and the coupling is in the coupled state.

The invention is also embodied as an aircraft air circuit comprising a first portion opening via a first orifice onto a first wall, a second portion opening via a second orifice onto a second wall and a connecting device according to the invention connecting the first and second orifices.

BRIEF DESCRIPTION OF THE DRAWINGS

For an understanding of embodiments of the disclosure, reference is now made to the following description taken in conjunction with the accompanying drawings, in which:

FIG. 1 is a side view of the first and second avionics racks, respectively, illustrating first and second portions of an air circuit connected by a connecting device in accordance with an exemplary embodiment;

FIG. 2 is a perspective view of a coupling, in a disconnected state, of the connecting device shown in FIG. 1, and of the first and second coupling systems of the connecting device shown in FIG. 1 which are provided respectively on the first and second avionics racks;

FIG. 3 is a perspective view of the coupling shown in FIG. 2, positioned on the first avionics rack;

FIG. 4 is a perspective view of a locking system of the connecting device;

In the accompanying drawings, like reference characters refer to the same or similar parts throughout the different views. The drawings are not necessarily to scale, emphasis instead being placed upon illustrating particular principles, discussed below.

DETAILED DESCRIPTION OF SOME EMBODIMENTS

Figure 5:
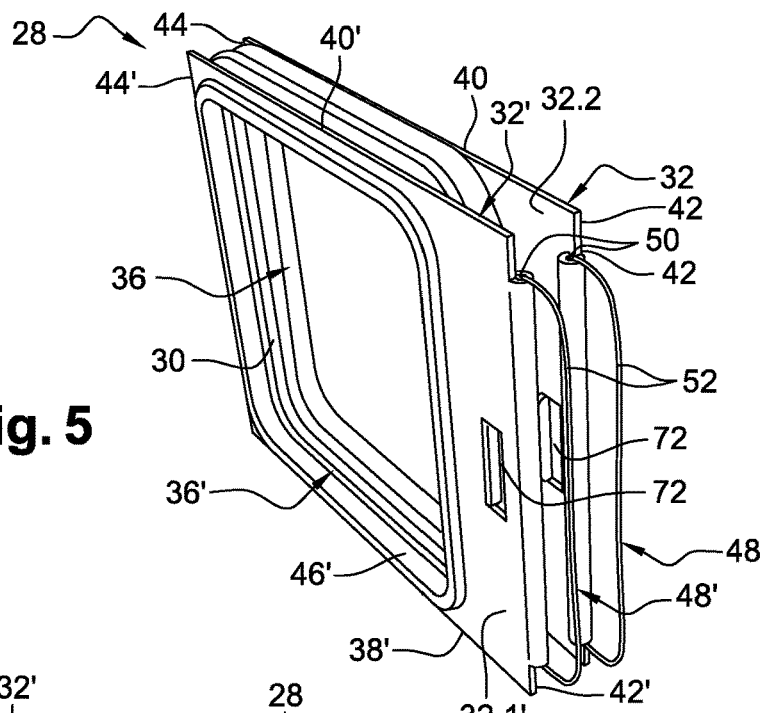
FIG. 5 is a perspective view of a coupling of a connecting device.

Some embodiments will now be described with reference to the Figures.

Referring to FIG. 1, a connecting device 10 in accordance with an exemplary embodiment is illustrated and configured to connect a first air circuit portion 12 positioned in a first avionics rack 14 and a second air circuit portion 12' positioned in a second avionics rack 14'.

The first avionics rack 14 may include a lower wall 16, an upper wall 18, a right-hand vertical lateral wall 20 as oriented in FIG. 1, and a left-hand vertical lateral wall 22 as oriented in FIG. 1 and connecting the lower and upper walls 16, 18. A second avionics rack 14' may comprise a lower wall 16', an upper wall 18', and a right-hand vertical lateral wall 22' as oriented in FIG. 1, and a left-hand vertical lateral wall 20' as oriented in FIG. 1 and connecting the lower and upper walls 16', 18'. The second avionics rack 14' is positioned in relation to the first avionics rack 14 in such a way that its right-hand vertical lateral wall 22' is positioned facing the left-hand vertical lateral wall 22 of the first avionics rack 14.

According to one configuration, the first air circuit portion 12 opens onto the left-hand vertical lateral wall 22 via a first orifice 24. The second air circuit portion 12' opens onto the right-hand vertical lateral wall 22' via a second orifice 24', positioned approximately facing the first orifice 24.

As best seen in FIG. 1, the first and second avionics racks 14, 14' may be substantially identical, but the first and second avionics racks 14, 14' may be different and have differing shape and configuration. The first portion of air circuit 12 opens via a first orifice 24 onto a first wall 22 and a second portion of air circuit 12' opens via a second orifice 24' onto a second wall 22'. At the periphery of the first and second orifices 24, 24', the first and second walls 22, 22' are more or less planar.

According to one configuration, the first and second orifices 24, 24' are identical. According to an exemplary embodiment, the first and second orifices 24, 24' have a cross section that is approximately square with rounded corners. Other shapes, configurations, and geometry for the cross section of the first and second orifices 24, 24' are contemplated to be within the scope of the disclosure. The first and second orifices 24, 24' each may have a given cross section.

The connecting device 10 comprises:

a first coupling system 26 configured to be connected to the first wall 22 near the first orifice 24, a second coupling system 26' configured to be connected to the second wall 22', a coupling 28 which has a flexible sleeve 30, a first frame 32, connected in fluid-tight manner to a first end of the flexible sleeve 30, configured to collaborate with the first coupling system 26 in such a way as to surround the first orifice 24 and provide a seal between the first wall 22 and the first frame 32 and a second frame 32', connected in a fluid-tight manner to a second end of the flexible sleeve 30, configured to collaborate with the second coupling system 26' in such a way as to surround the second orifice 24' and provide a seal between the second wall 22' and the second frame 32'.

The first coupling system 26 comprises a first slide-way connection 34 configured to allow the first frame 32 to move with respect to the first wall 22 in a first direction of introduction DI parallel to the first wall 22. Similarly, the second coupling system 26' comprises a second slide-way connection 34' configured to allow the second frame 32' to move with respect to the second wall 22' in a second direction of introduction DI' parallel to the second wall 22'.

The first and second slide-way connections 34, 34' are configured in such a way that first and second directions of introduction DI, DI' are approximately parallel. The fact that the sleeve 30 is flexible means that a certain discrepancy and tolerances between the first and second directions of introduction DI, DI' can be accommodated.

The first and second slide-way connections 34, 34' also allow the coupling 28 to move between a connected first state in which the flexible sleeve 30 coincides with the first and second orifices 24, 24', and provide fluidic continuity between the first and second portions of the air circuit 12, 12', and a disconnected second state in which the flexible sleeve 30 does not coincide with the first and second orifices 24, 24' and does not provide any fluidic continuity between the first and second portions of the air circuit 12, 12'.

The first frame 32 has a first face 32.1 (referred to as the exterior face) facing towards the avionics rack 14 when the coupling 28 is in the coupled state, and a second face 32.2 connected in fluid-tight manner to a first end of the flexible sleeve 30. The second frame 32' has a first face 32.1' (referred to as the exterior face), facing towards the avionics rack 14' when the coupling 28 is in the coupled state, and a second face 32.2' connected in fluid-tight manner to a second end of the flexible sleeve 30.

Each frame 32 (or 32') may comprise an opening 36 (or 36') connecting the first and second faces 32.1, 32.2 (or 32.1', 32.2') that has a cross section identical to or slightly larger than that of the first or second orifice 24 (or 24') with which the frame 32 (or 32') collaborates. Each frame 32 (or 32') also may comprise first and second edges 38, 40 (or 38', 40') which are rectilinear and parallel and arranged on either side of the opening 36 (or 36') and third and fourth edges 42, 44 (or 42', 44') likewise arranged either side of the opening 36 (or 36').

According to one configuration, when the coupling 28 is in the coupled state, the first and second edges 38, 40 (38', 40') are horizontal, the first edge 38 (or 38') is positioned below the opening 36 (or 36'), the second edge 40 (or 40') is positioned above the opening 36 (or 36').

According to an exemplary embodiment, each frame 32, 32' may have a square or rectangular outline. Each frame 32, 32' takes the form of a plate having a thickness between 3 and 10 mm. For example, each frame 32, 32' may be made of metal or made of composite material.

The connecting device may comprise a first peripheral seal 46, surrounding the first opening 36, interposed between the first frame 32 of the coupling 28 and the first wall 22 of the first avionics rack 14, and a second peripheral seal 46', surrounding the second opening 36', interposed between the second frame 32' of the coupling 28 and the second wall 22' of the second avionics rack 14' once the connecting device is mounted.

The first and second coupling systems 26, 26' allow the first and second frames 32, 32' to be kept pressed firmly against the first and second walls 22, 22', respectively, slightly compressing the first and second peripheral seals 46, 46'.

According to an exemplary embodiment, the coupling 28 the first peripheral seal 46 may be connected to the first face 32.1 of the first frame 32, and the second peripheral seal 46' may be connected to the first face 32.1' of second frame 32'. The connection between the first or second peripheral seal 46, 46' and the first or second frame 32, 32' is obtained by overmoulding. For example, the first and second peripheral seal 46, 46' may be made from a material of the elastomer type. Alternatively, the first and second peripheral seals 46, 46' could be respectively connected to the first and second walls 22, 22' of the avionics racks 14, 14'.

The flexible sleeve 30 of the coupling 28 is configured to deform so as to compensate for any potential misalignment there might be between the first and second orifices 24, 24'.

In one embodiment, the flexible sleeve 30 may be made from a material of the elastomer type and comprises at least one bellows. The connection between the ends of the flexible sleeve 30 and the second faces 32.2, 32.2' of the frames 32, 32' is obtained by overmoulding.

According to another feature, the coupling 28 may comprise at least one handle 48. According to one configuration, at least one of the first and second frames 32, 32' comprises a handle 48. In one embodiment, the third edge 42 of the first frame 32 has a hollow tube 50 obtained by rolling the third edge 42 over on itself. To complement that, the handle 48 is a more or less rigid cable 52, having a portion housed inside the hollow tube 50 and ends connected to one another to form a loop.

Figures 6, 7:
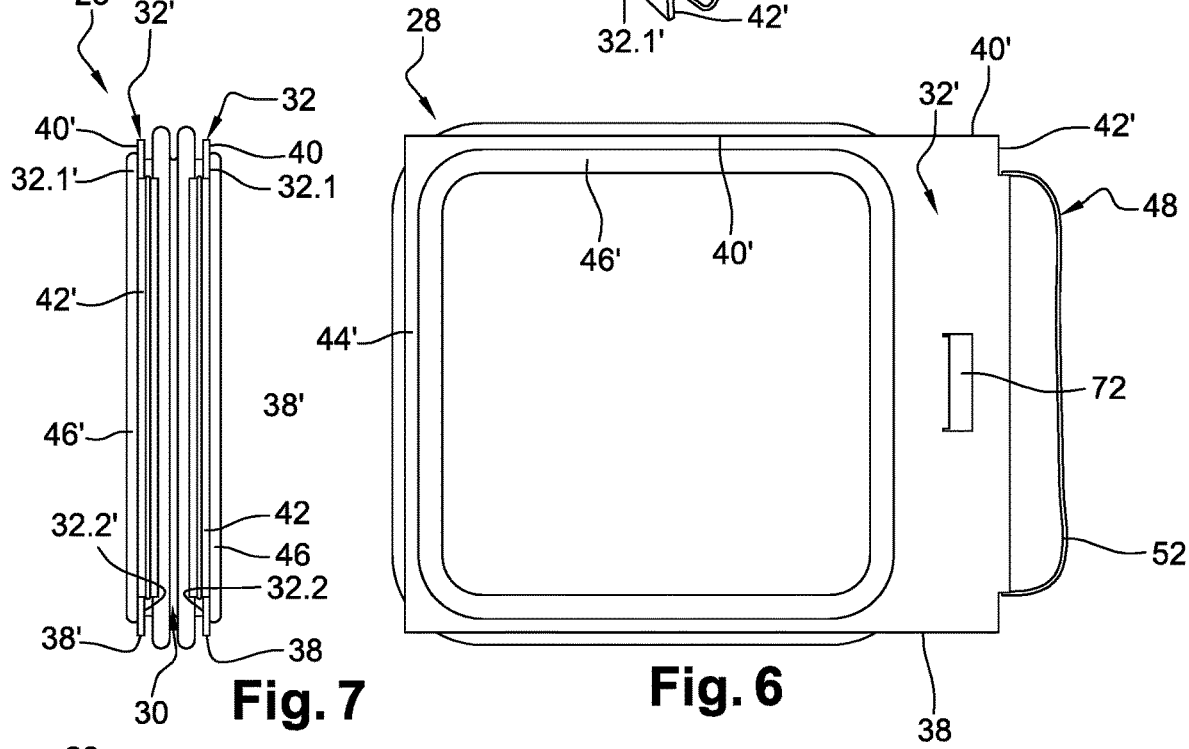
FIG. 6 is a side view of the coupling shown in FIG. 5.
FIG. 7 is a top plan view of the coupling shown in FIG. 5.
Figure 8:
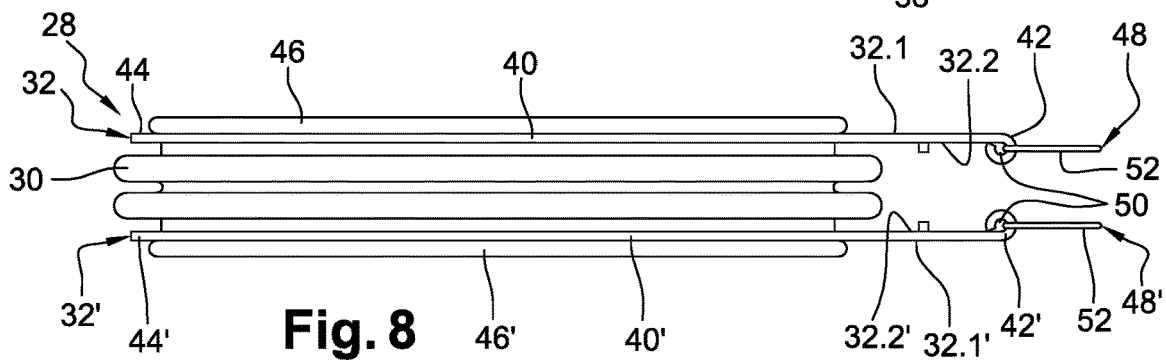
FIG. 8 is a side view of the coupling shown in FIG. 5.

Referring now to FIGS. 5 to 8, each frame 32, 32' comprises a handle 48, 48'. According to one configuration, the first and second frames 32, 32' are identical. The first slide-way 34 of the first coupling system 26 comprises first and second approximately rectilinear brackets 54, 56, securely attached to the first wall 22, arranged on either side of the first orifice 24, approximately parallel to one another and to the first direction of introduction DI, and configured to accept the first and second edges 38, 40 of the first frame 32 of the coupling 28. According to one embodiment, the first and second brackets 54, 56, may comprise first and second ends, respectively, via which the first frame 32 is introduced, which flare out to make it easier for the first frame 32 to be introduced.

The second slide-way 34' of the second coupling system 26' may comprise approximately rectilinear first and second brackets 54', 56' securely attached to the second wall 22', arranged on either side of the second orifice 24', approximately parallel to one another and to the second direction of introduction DI' and configured to accept the first and second edges 38', 40' of the second frame 32' of the coupling 28. According to one embodiment, the first and second brackets 54', 56' may comprise first and second ends, respectively, via which the second frame 32' is introduced, which flare out to make it easier for the second frame 32' to be introduced.

Referring back to FIG. 2, each bracket 54, 54', 56, 56' comprises a first flange 58 pressed firmly against the first or second wall 22, 22' and connected thereto by any appropriate means, a second flange 60 parallel to the first flange 58, spaced away from the first or second walls 22, 22', and a web 62 connecting the first and second flanges 58, 60. Each bracket 54, 54', 56, 56' is positioned in such a way that the second flange 60 is closer to the first or second orifice 24, 24' than the first flange 58. The second flange 60 is separated from the first or second wall 22, 22' by a distance capable of housing the first or second frame 32, 32' and the first or second peripheral seal 46, 46', with which that bracket collaborates, achieving a small degree of compression of the first or second peripheral seal 46, 46'.

The brackets 54, 54', 56, 56' all have the same cross section and the same length which is greater than the diameter of the first or second orifice 24, 24'. The disclosure is not limited to the embodiment concerning the first and second slide-ways 34, 34'.

According to another feature, at least one of the first and second coupling systems 26, 26' may comprise an end stop 64 configured to halt the translational movement of the coupling 28 in the coupled state. According to one embodiment, the end stop 64 takes the form of a third bracket 66, 66', which has a cross section identical to that of the first and second brackets 54, 54', 56, 56' and which is configured to accept the fourth edge 44, 44' of the first or second frame 32, 32'.

According to one configuration, the first and second coupling systems 26, 26' may comprise first and second end stops 64, 64', respectively. Thus, they each comprise three brackets 54, 56, 66, 54', 56', 66' forming a C-shape, the first and second brackets 54, 56, 54', 56' being horizontal and the third bracket 66, 66' being vertical and connecting the first and second brackets 54, 56, 54', 56'.

According to another feature, at least one of the first and second coupling systems 26, 26' comprises a locking system 68 configured to immobilize the coupling 28 in the coupled state. The locking system 68 and the end stops 64 are arranged on either side of the first or second orifice 24, 24', the coupling 28 being immobilized between the end stop 64 and the locking system 68 in the coupled state.

The locking system 68 may comprise a flexible tongue 70 which has a base 70.1 secured to the first or second wall 22, 22' and a tab portion 70.2 having an end 70.3 oriented towards the first or second orifice 24, 24', configured to deform elastically between a rest state, in which the end 70.3 is spaced away from the first or second wall 22, 22' and immobilizes the coupling 28 in the coupled state, and a deformed state in which the end 70.3 is stuck to or close to the first or second wall 22, 22' so as to allow the coupling 28 to be disconnected. In one configuration, each of the first and second coupling systems 26, 26' comprises a locking system 68, 68'. To complement that, the locking system 68 comprises at least one cutout 72, provided on at least one of the first and second frames 32, 32', configured to house the end 70.3 of the flexible tongue 70 when the latter is in the rest state and the coupling 28 is in the coupled state.

The principle of operation of the connecting device is now described. Using the handle or handles 48, 48', the coupling 28 is positioned between the two avionics racks 14, 14', the flexible sleeve 30 can compress to adapt to suit the spacing between the two avionics racks 14, 14'. The first and second frames 32, 32' of the coupling 28 are introduced into the first and second slide-ways 34, 34', respectively. The flared shapes of the ends of the first and second slide-ways 34, 34' make it easier for the first and second frames 32, 32' to be introduced blind. The capacity of the flexible sleeve 30 to deform makes it possible to compensate for any potential misalignment there might be between the first and second orifices 24, 24'. In the direction of introduction, the flexible tongue 70 of each locking system 68, 68' becomes pressed firmly against the first or second wall 22, 22' so as to allow the coupling 28 to pass. This coupling is pushed in until the first and/or second frames 32, 32' come into contact with the first and/or second end stops 64, 64'. At this point, the flexible tongue 70 of each locking system 68, 68' automatically reverts to the rest position and its end 70.3 becomes housed in the cutout 72 of the first or second frame 32, 32' with which it collaborates.

In order to disconnect the coupling 28, each flexible tongue 70 of each locking system 68, 68' is deformed using a tool so as to allow the coupling 28 to be removed. This tool may take the form of a plate inserted between the frame 32 or 32' and the flexible tongue 70.

The connecting device allows easy and quick mounting without the use of tools, in a limited space between two avionics racks. And removing the connecting device can be performed easily and quickly using a simple tool. The flexible sleeve may be able to adapt to the variable spacing between two avionics racks because of its deformability, which will also make it possible to compensate for misalignment between the orifices 24, 24' of the two avionics racks.

The cross section of the openings 36, 36' of the first and second frames 32, 32' can be adapted to suit the cross section of the orifices 24, 24' which may not be identical and which may have circular, ovoid, rectangular or other cross sections. The connecting device has a low mass and does not affect the on-board mass of the aircraft. Finally, although described in an application for two avionics racks, the connecting device can be used for connecting two portions of an air circuit that opens via two orifices provided on two walls.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A coupling for connecting a first orifice of a first portion of an air circuit opening onto a first wall and a second orifice of a second portion of an air circuit opening onto a second wall, wherein the coupling comprises:
   a flexible sleeve,
   a first frame having a first face,
   the first frame having a second face connected in fluid-tight manner to a first end of the flexible sleeve and a first opening connecting the first and second faces,
   the first frame being configured to collaborate with a first coupling system having a first slide-way connection to allow the first frame to move with respect to the first wall in a first direction of introduction parallel to the first wall,
   a second frame having a first face,
   the second frame having a second face connected in fluid-tight manner to a second end of the flexible sleeve and a second opening connecting the first and second faces, the second frame being configured to collaborate with a second coupling system having a second slide-way connection to allow the second frame to move with respect to the second wall in a second direction of introduction parallel to the second wall.

2. The coupling according to claim 1, wherein the first face of the first frame further comprises a first peripheral seal surrounding the first opening and, wherein the first face of the second frame comprises a second peripheral seal surrounding the second opening.

3. The coupling according to claim 1, further comprising at least one handle.

4. The coupling according to claim 1, wherein one edge of at least one of the first and second frames comprises a hollow tube and, wherein each handle comprises a cable having a portion housed inside the hollow tube and ends connected to one another in order to form a loop.

5. A connecting device for connecting a first orifice of a first portion of an air circuit opening onto a first wall, and a second orifice of a second portion of an air circuit opening onto a second wall, the connecting device comprising:
   a coupling according to claim 1, a first coupling system configured to be connected to the first wall near the first orifice, comprising a first slide-way connection configured to allow the first frame to move with respect to the first wall in a first direction of introduction, parallel to the first wall and
   a second coupling system configured to be connected to the second wall near the second orifice, comprising a second slide-way connection configured to allow the second frame to move with respect to the second wall in a second direction of introduction, parallel to the second wall, the coupling being able to move between a coupled state in which the flexible sleeve coincides with the first and second orifices and a disconnected state in which the flexible sleeve does not coincide with the first and second orifices.

6. The connecting device according to claim 5, wherein each of the first and second slide-ways further comprises first and second brackets secured to the first or second wall, arranged on either side of the first or second orifice and configured to accept first and second edges of the first or second frame of the coupling, the first and second brackets comprising first and second ends, respectively, via which the first or second frame is introduced, which flare out in order to make it easier for the first or second frame to be introduced.

7. The connecting device according to claim 5, wherein at least one of the first and second coupling systems further comprises an end stop configured to halt the translational movement of the coupling in the coupled state.

8. The connecting device according to claim 5, wherein at least one of the first and second coupling systems further comprises a locking system configured to immobilize the coupling in a coupled state, the coupling being immobilized between the end stop and the locking system in the coupled state.

9. The connecting device according to claim 5, wherein the locking system further comprises a flexible tongue which has a base secured to the first or second wall as well as a tab portion having an end oriented towards the first or second orifice, configured to deform elastically between
 a rest state in which the end is spaced away from the first or second wall and immobilizes the coupling in the coupled state, and
 a deformed state in which the end is stuck against or close to the first or second wall so as to allow the coupling to be disconnected.

10. The connecting device according to claim 9, wherein the locking system further comprises at least one cutout provided on at least one of the first and second frames and configured to house the end of the flexible tongue when the latter is in the rest state and the coupling is in the coupled state.

11. An aircraft air circuit, comprising a first portion opening via a first orifice onto a first wall, a second portion opening via a second orifice onto a second wall, and a connecting device according to claim 5 connecting the first and second orifices.

12. An aircraft avionics rack coupling, comprising:
 a first frame;
 a second frame;
 a flexible sleeve having a first end and a second end;
 the first frame having a first face and a second face connected to the first end of the flexible sleeve, and a first opening connecting the first and second faces;
 the second frame having a first face and a second face connected to the second end of the flexible sleeve, and a second opening connecting the first and second faces;
 a first coupling system having a first slide-way connection allowing the first frame to move relative to a first wall of a first air circuit portion in a direction parallel to the first wall; and,
 a second coupling system having a second slide-way connection allowing the second frame to move relative to a second wall of a second air circuit portion in a direction parallel to the second wall.

\* \* \* \* \*